United States Patent [19]

Thompson et al.

[11] Patent Number: 4,785,411

[45] Date of Patent: Nov. 15, 1988

[54] CASCADE FILTER STRUCTURE WITH TIME OVERLAPPED PARTIAL ADDITION OPERATIONS AND PROGRAMMABLE TAP LENGTH

[75] Inventors: Charles D. Thompson; Joseph P. Gergen; Bradley Martin; Garth D. Hillman, all of Austin, Tex.

[73] Assignee: Motorola, Inc., Schaumburg, Ill.

[21] Appl. No.: 901,850

[22] Filed: Aug. 29, 1986

[51] Int. Cl.[4] .............................................. G06F 7/38
[52] U.S. Cl. ............................................... 364/724.19
[58] Field of Search ............... 364/724, 768, 772, 738, 364/200 MS File, 736; 375/117

[56] References Cited

U.S. PATENT DOCUMENTS

| 4,569,062 | 2/1986 | Dellande et al. | 375/117 |
| 4,584,659 | 4/1986 | Stikvoort | 364/724 |
| 4,586,153 | 4/1986 | Hobrough | 364/724 |
| 4,644,488 | 2/1987 | Nathan | 364/724 |
| 4,644,547 | 2/1987 | Vercellotti et al. | 364/200 |

OTHER PUBLICATIONS

Nagle, Jr. et al., "An Introduction to Computer Logic", 1975, pp. 450-451.

Primary Examiner—Gary V. Harkcom
Assistant Examiner—Long Thanh Nguyen
Attorney, Agent, or Firm—John A. Fisher; Jeffrey Van Myers; Robert L. King

[57] ABSTRACT

A filter structure uses multiple discrete filter circuits which are cascaded to provide a multiple tap filter of programmable tap length. In one form, an FIR filter may be implemented wherein each circuit generates partial sum operands which must be added to provide a filter output. The cascaded circuits perform partial addition operations near simultaneously by using a serial addition which is synchronized with a start bit. The number of taps in the filter structure implemented by the cascaded discrete filter circuits is variable and may be programmed with a programmable storage register in each discrete circuit which stores operand data fixing the tap length of each discrete circuit. The multiple filter circuits provide a single filter structure with a large tap length and high sampling rate.

8 Claims, 4 Drawing Sheets

CASCADE FILTER STRUCTURE WITH TIME OVERLAPPED PARTIAL ADDITION OPERATIONS AND PROGRAMMABLE TAP LENGTH

TECHNICAL FIELD

This invention relates generally to digital circuits, and more particularly, to cascaded circuits which implement a digital function such as filtering.

BACKGROUND ART

Digital circuits are utilized to implement a wide variety of functions. Filters are commonly implemented with digital circuitry because of the precision and accuracy attained as opposed to analog circuitry. A well known digital filter is the finite impulse response (FIR) filter which is particularly useful in telecommunications. The FIR filtering process is a weighted moving average of previous data values, and the FIR filtering equation is an accumulation of an integer number of product terms. A special class of filters which may be implemented with an FIR filter is an adaptive filter. An adaptive filter provides an error signal which represents the difference between a desired signal and an estimate of the desired signal. The accuracy of FIR fiters and adaptive filters is proportional to the number of recent data samples, referred to as "filter taps", which are stored by the filter. Since data storage is limited in each filter circuit, others have coupled together or cascaded filter circuits, each implemented by a discrete integrated circuit, to provide a single filter structure with a very large number of taps. Unfortunately, partial sums are generated by each integrated circuit and the partial sums must be added external to the integrated circuits. Not only is additional external summing circuitry required, but filter speed is reduced due to delays inherent in adding the partial sums.

BRIEF DESCRIPTION OF THE INVENTION

Accordingly, an object of the present invention is to provide an improved cascaded filter structure.

Another object of the present invention is to provide an improved circuit having a plurality of cascaded circuits with partial addends.

Yet another object of the present invention is to provide an improved cascaded filter structure which sums multiple addends by time overlapped additions.

A further object of the present invention is to provide an improved filter structure having programmable tap lengths.

In carrying out the above and other objects of the present invention, there is provided, in one form, a cascade filter structure having a plurality of rank ordered circuits. Each of the circuits performs predetermined arithmetic calculations on predetermined operands to provide a rank ordered output sum. The rank ordered output sum of each rank ordered circuit except the lowest ranked circuit is added to the output sum of the circuit of immediately lower rank by an interface circuit to provide an output sum. The interface circuit comprises an input terminal for receiving a rank ordered output sum of immediately lower rank which is used as a first addend. A data initiation detection portion is coupled to the input terminal for providing a control signal in response to detection of receipt of the first addend. A control portion is coupled to the data initiation detection portion for providing a second addend in response to the control signal synchronous to receipt of the first addend. An adder portion is coupled to the input terminal and the control portion, for adding the first and second addends and outputting a sum as the rank ordered output sum of predetermined rank, said highest ranked sum representing a sum of all partial sums of the circuits.

These and other objects, features and advantages will be more clearly understood from the following detailed description taken in conjunction with the accompanying drawings.

DETAILED DESCRIPTION OF THE INVENTION

Figure 1:
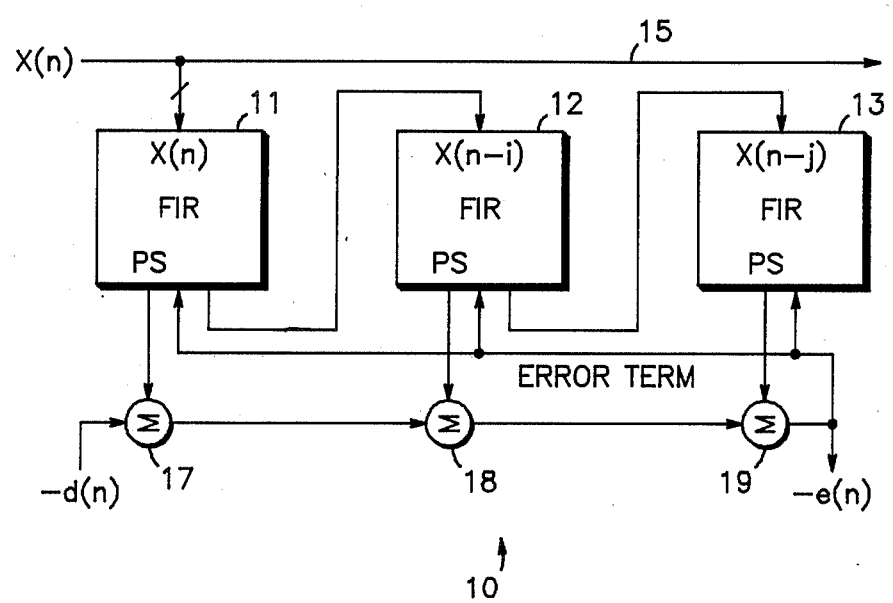
FIG. 1 illustrates in block diagram form a cascaded filter structure known in the art.

Shown in FIG. 1 is a conventional multiple tap adaptive filter 10. In the illustrated form, adaptive filter 10 has a plurality of discrete finite impulse response (FIR) filters 11, 12 and 13. A data sample, x(n), is transmitted via a transmission line 15 and coupled to a data input labeled "X" of FIR filter 11. A first output of FIR filter 11 is connected to a time sampled data input labeled "X(n−i)" of FIR filter 12. A partial sum output labeled "PS" of FIR filter 11 is connected to a first input of an adder 17. A reference signal labeled "−d(n)" which is the desired input of adaptive filter 10 is coupled to a second input of adder 17. A first output of FIR filter 12 is connected to a time sampled data input labeled "x(n−j)" of FIR filter 13. A partial sum output labeled "PS" of FIR filter 12 is connected to a first input of an adder 18. An output of adder 17 is connected to a second input of adder 18. A partial sum output labeled "PS" of FIR filter 13 is connected to a first input of an adder 19. An output of adder 18 is connected to a second input of adder 19. An output of adder 19 provides an inverted error term signal labeled "−e(n)" which is connected to an error input of each of FIR filters 11, 12 and 13.

In operation, the adaptive filtering performed by adaptive filter 10 involves two computations. The data input x(n) is passed thru FIR filters 11, 12 and 13 which are time varying filters. FIR filters 11, 12 and 13 perform a discrete convolution of the digitized input x(n) with an impulse waveform. This is performed by a first computation involving summing a series of multiplications of data samples and coefficients representing an impulse response of a desired filter. The number of multiplications performed is commonly referred to as the number of "taps" which an FIR filter has. Accuracy of an FIR filter is directly proportional to the number of taps. For each tap implemented, a coefficient value and a data sample must be stored. Since the amount of storage is limited in a single integrated circuit, multiple circuits may be coupled serially such as FIR filters 11–13 are coupled in order to increase the tap size of an FIR filter.

An adaptive filter is a special type of filter which commonly uses an FIR filter structure having coefficients updated using the Least Mean Square (LMS) algorithm. In an adaptive filter, a data signal x(n) is FIR filtered to provide an estimate of a second input signal [−d(n)]. Input signal [−d(n)] represents a negative value of a known desired input. For example, in an echo cancelling application for a telephone line, the estimate signal [−d(n)] typically represents the two's complement of the input term echoed back from a four-wire to two-wire hybrid circuit (not shown). The second computation which an adaptive filter calculates is the difference between input data signal x(n) and estimate signal e(n). Any resultant is provided as an error signal e(n). The error term e(n) is used to modify every FIR filter coefficient so that the filter coefficients converge to values which consistently minimize the adaptive filter's output. Therefore, adaptive filter 10 is able to estimate the d(n) input by passing the x(n) input through FIR filters 11–13. FIR filter 11 calculates a partial sum involving an accumulation of a predetermined number of data and coefficient products. The partial sum cannot be added internally by FIR filter 12 which also calculates a partial sum involving an accumulation of a predetermined number of data and coefficient products. Therefore, individual adder circuits 17, 18 and 19 must be used to add the generated partial sums with the negative of estimate signal d(n). Theseparate subtraction operations require additional circuitry resulting in a much larger adaptive filter and imposing a severe size penalty for large tap size adaptive filters. Further, since the subtraction operation is performed after the partial sum of each of FIR filters 11–13 is calculated, additional delay exists before adaptive filter 10 is able to generate output error term e(n).

Figure 2:
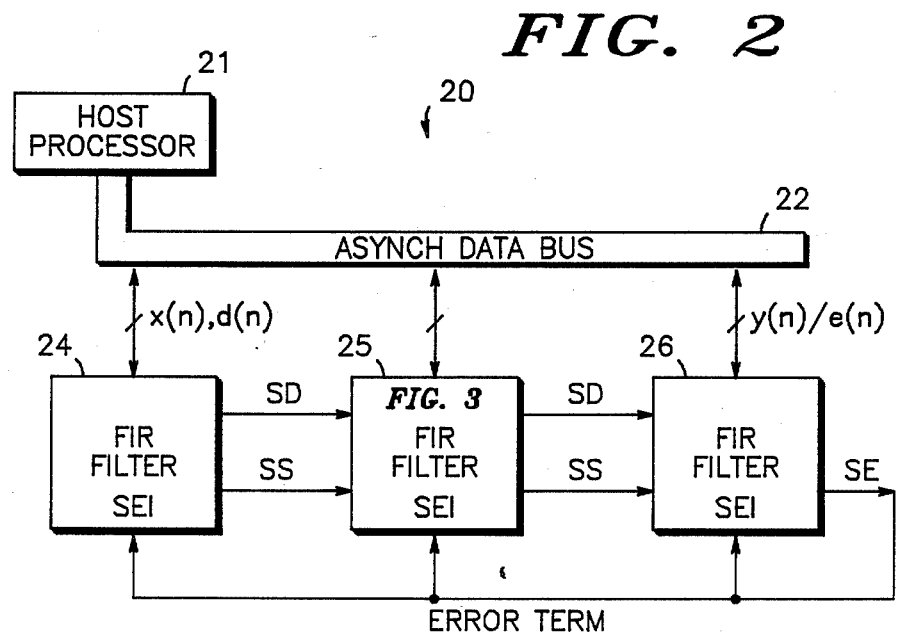
FIG. 2 illustrates in block diagram form a cascaded filter structure in accordance with the present invention.

Shown in FIG. 2 is a cascade filter structure 20 for communicating operands with a host processor 21 via an asynchronous data bus 22. Filter structure 20 is shown as being implemented with three rank ordered FIR filters 24, 25 and 26. However, it should be apparent that any plurality of FIR filters may be utilized in the manner taught herein. FIR filter 24 has a bidirectional input terminal coupled to data bus 22 for communication of time sampled input data labeled x(n), for communication of a time corresponding input estimate signal labeled d(n), and for communication of initialization operands to be discussed below. A data output of FIR filter 24, labeled "SD" for "serial data", is connected to a serial data input of FIR filter 25. A sum output of FIR filter 24, labeled "SS" for "serial sum", is connected to a sum input of FIR filter 25. FIR filter 25 has a bidirectional input terminal coupled to data bus 22 for communication of initialization operands discussed below. A data output of FIR filter 25, also labeled "SD" for "serial data", is connected to a serial data input of FIR filter 26. A sum output of FIR filter 25, also labeled "SS" for "serial sum", is connected to a sum input of FIR filter 26. FIR filter 26 has a bidirectional input terminal connected to data bus 22 for communication of a time sampled output data signal y(n) when FIR filters 24–26 are used only as a finite impulse response filter, for communication of a time sampled error signal e(n) when FIR filters 24–26 are used as an adaptive filter, and for communication of initialization operands. An output of FIR filter 26 labeled "SE" provides a serial error output signal which is connected to a serial error input terminal, labeled "SEI" of each of FIR filters 24–26.

In operation, filter structure 20 may function in several modes including an FIR filter mode or an adaptive filter mode. In an FIR filter mode, input operands x(n) and [−d(n)] are coupled from data bus 22 to FIR filter 24 in response to host processor 21. Initialization operands provided from host processor 21 are also coupled to each of FIR filters 24–26 for programming each filter circuit including setting all tap coefficient values and programming the number of taps which each of FIR filters 24–26 will have. The exact operation of FIR filters 24–26 may be better understood by referring to the specific structure of each of FIR filters 24–26 which in a preferred form are each structurally identical. The output y(n) of filter structure 20 when operated in the FIR filter mode is equal to:

$$y(n) = \sum_{i=0}^{N-1} h(i) x(n - i) \qquad (1)$$

where:
  n = the time index
  i = the filter tap index
  N = the number of taps
  h(i) = the ith coefficient
  x(n−i) = the ith most recent data sample.

In the adaptive filter mode, the output error term is equal to:

$$e(n) = d(n) - \sum_{i=0}^{N-1} h(i) x(n - i) \qquad (2)$$

where the notation is the same as described for equation one. The error term of equation two is utilized to modify the coefficient values in accordance with the conventional least mean square (LMS) algorithm. The value of an updated coefficient, $h_{new}$, may be represented as:

$$h_{new} = h_{old} + (k)(e)[x(n-i)] \qquad (3)$$

where:
  n = time index
  x(n−i) = the "i"th most recent data sample
  k = a gain constant
  e = a calculated error term
  $h_{old}$ = current value of the "i"th coefficient.

Each of FIR filters 24–26 is able to internally modify the coefficients. Conventional control circuitry (not shown) directs the mode of filter structure 20 and whether FIR filter 26 outputs FIR signal y(n) or adaptive signal e(n).

Figure 3:
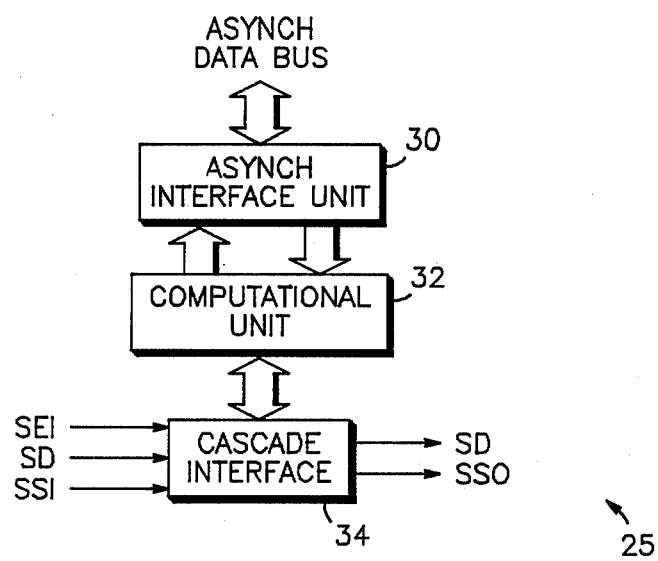
FIG. 3 illustrates in block diagram form one of the filter portions of the structure of FIG. 2.

Shown in FIG. 3 is a detailed block diagram of FIR filter 25 illustrated in FIG. 2. Asynchronous data bus 22 is connected to an input/output (I/O) terminal of an asynchronous interface unit 30. An output of asynchronous interface unit 30 is connected to an input of a computational unit 32. An output of computational unit 32 is connected to an input of asynchronous interface unit 30. An input/output terminal of computational unit 32 is connected to an input/output terminal of a cascade interface circuit 34. Interface circuit 34 has a first input (SEI) for receiving the serial error (SE) signal, and a second input for receiving serial data, SD, from an FIR filter of immediately lower rank. In the illustrated form, the serial data input is coupled from the SD output of FIR filter 24. A third input (SSI) of interface circuit 34 receives a serial sum (SS) from an FIR filter of immediately lower rank which in the illustrated form is FIR filter 24. A first output of interface circuit 34 provides a serial data (SD) output for coupling to an FIR filter of immediately higher rank. A second output of interface circuit 34 provides a serial sum output (SSO) also for coupling to an FIR filter of immediately higher rank.

In the illustrated form, asynchronous interface unit 30 of FIR filter 25 functions to coordinate the transfer of initialization data between data bus 22 and computational unit 32. Asynchronous interface unit 30 also functions to input new data samples x(n), d(n) and read new output samples y(n)/e(n). Computational unit 32 functions to perform the calculations required by equations one thru three above. Cascade interface circuit 34 functions to coordinate the transfer of data and partial sums between each computational unit of the cascaded FIR filters 24–26.

Figure 4:
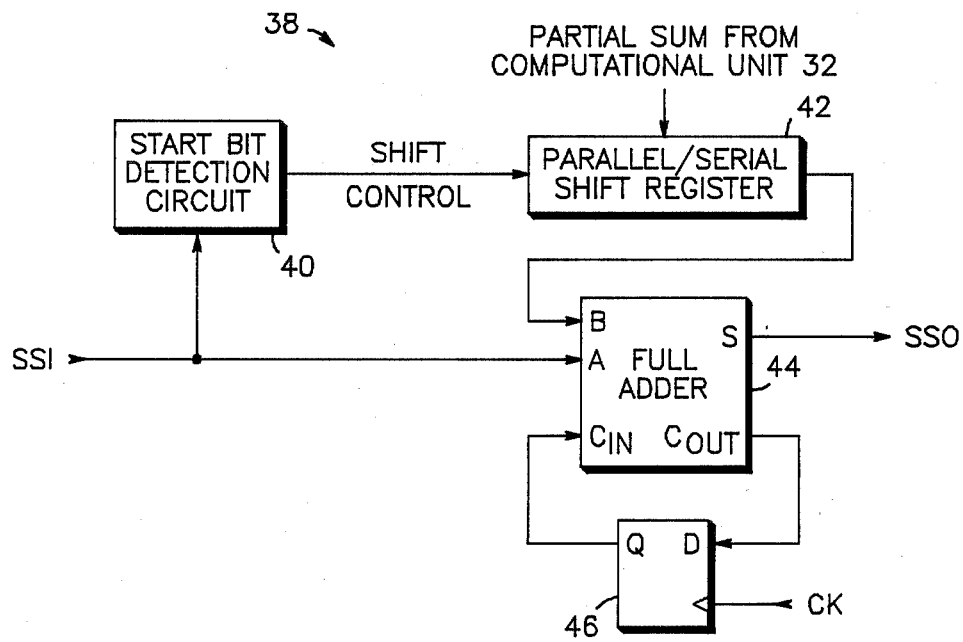
FIG. 4 illustrates in block diagram form a portion of a cascading interface circuit illustrated in FIG. 3.

Shown in FIG. 4 is a sum portion 38 of cascade interface circuit 34 of FIG. 3 for performing the partial addition operations required when FIR filters are cascaded. FIG. 4 illustrates partial sum addition in cascaded FIR filters by creating time overlapped partial addition operations with the other FIR filters. A serial sum input, labeled SSI, from lower ranked FIR filter 24 is connected to both an input of a start bit detection circuit 40 and to a first input labeled "A" of a full adder circuit 44. An output of start bit detection circuit 40 provides a shift control signal which is connected to a control input of a parallel/serial shift register 42. A partial sum from computational unit 32 is connected to a data input of shift register 42. An output of shift register 42 is connected to a second input labeled "B" of full adder 44. A sum output terminal labeled "S" of full adder 44 provides a serial sum output labeled "SSO". A carry-out output terminal labeled "COUT" of full adder 44 is connected to a data input terminal labeled "D" of a flip-flop 46. A clock signal labeled "Ck" is coupled to a clock input of flip-flop 46, and a data output terminal labeled "Q" of flip-flop 46 is connected to a carry input terminal labeled "$C_{IN}$" of full adder 44.

In operation, sum portion 38 functions to receive a serial sum input, SSI, representing a partial sum from at least one lower ranked FIR filter circuit and add the SSI input to a partial sum from the FIR filter which sum portion 38 is a part of. Sum portion 38 provides a serial sum output, SSO, which may be coupled to an FIR filter of higher rank. A first of the serial bits received by both full adder 44 and start bit detection circuit 40 is utilized as a start bit. Start bit detection circuit 40 is a conventional circuit which provides an output shift control signal. The shift control signal serially shifts the partial sum coupled to shift register 42 from computational unit 32 to full adder 44 at a shift rate in synchronization with the receipt of data at the SSI sum input terminal. The partial sum from computational unit 32 is used as a first addend to form the output partial sum SSO. The second bit of the serial input bits received from a lower ranked FIR filter is a second addend bit used in forming the output partial sum SSO. Full adder 44 sums the first and second addend inputs at inputs A and B to provide a sum output. A carry output bit, COUT, is also generated by full adder 44 and connected to flip-flop 46 which is clocked at substantially the same clock rate as the shift control signal. The output of flip-flop 46 is connected to the carry input terminal of full adder 44 which allows full adder 44 to form the correct sum as the serial output is generated. It should be readily apparent that the present invention may be practised by other techniques than using a start bit detection scheme. For example, detection of a data valid signal from a lower ranked circuit may be used to initiate synchronization of the addition of received data from a lower ranked circuit with a partial sum addend.

Figure 5:
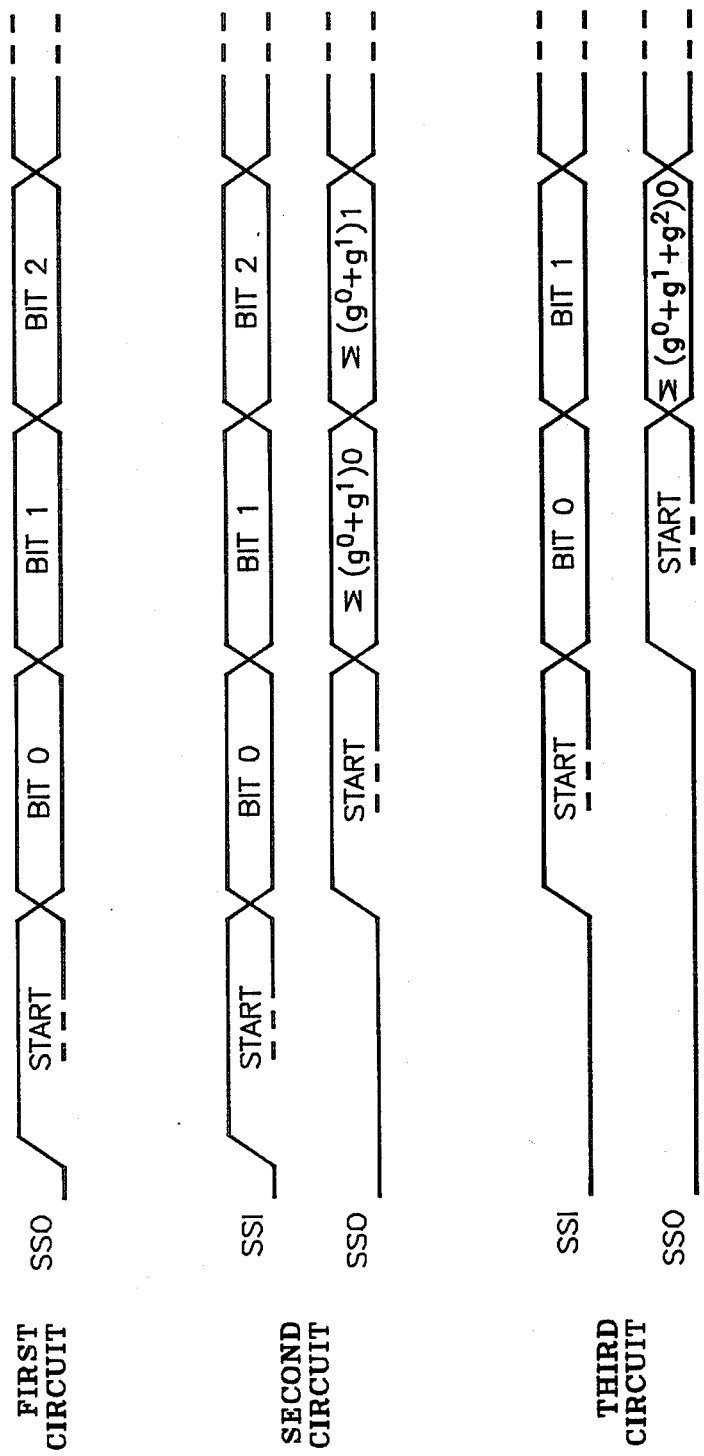
FIG. 5 illustrates in graphical form a timing diagram of the filter structure of FIG. 2.

Shown in FIG. 5 is a graph illustrating the timing of addition operations in a filter structure having three integrated circuit FIR filters such as that illustrated in FIG. 2. In the first integrated circuit, the first output bit is a start bit for the next higher ranked integrated circuit. A portion of the previously mentioned initialization operands which host processor 21 sends to the first integrated circuit is used for directing the first integrated circuit (i.e. lowest ranked FIR filter 24) to transmit a start bit before transmitting serial data bits. Therefore, the first or lowest ranked integrated circuit does not require a start bit detection circuit and disables the start bit detection circuit if such a circuit is incorporated into the lowest ranked integrated circuit. The remaining successive bits from the lowest ranked integrated circuit are partial sum bits zero, one, two, etc., the number of which is related to the width of accumulator circuit (not shown) implemented in each integrated circuit filter. Each of these bits may have either a logic one or a logic zero value depending upon the partial sum generated by the first circuit. In the second cascaded integated circuit, the serial sum input, SSI, is identical to the serial sum output, SSO, of the first integrated circuit. The timing of the outputting of the serial sum output of the second circuit is delayed by one bit period or clock cycle so that the start bit for the next higher ranked integrated circuit filter is outputted when the first bit of the partial sum from the lower ranked integrated circuit filter is received. The second bit outputted by the second integrated circuit filter is a first partial sum bit (designated by a "zero") formed by summing the partial sum of the first circuit, $g^0$, with the partial sum of the second circuit, $g^l$. Similarly, the third bit outputted by the second integrated circuit is represented as $(g^0+g^l)1$ which is the sum of the second bits (designated by a "one") of the first and second partial sums $g^0$ and $g^l$. Similarly, the timing of the serial sum input of the third integrated circuit filter is analogous to the timing of the serial sum output of the second integrated circuit filter. The serial sum output of the third integrated circuit filter comprises a start bit which is delayed from the input start bit by one bit period. The second bit of the output of the third circuit is the first output sum bit (designated by a "zero") of the first bits of the partial sums of the first, second and third integrated circuit filters $g^o$, $g^l$ and $g^2$, respectively.

Upon closer review of the timing of the sum operation illustrated in FIG. 5, it is readily apparent that the sum operations of each integrated circuit filter are time overlapped and synchronized by virtue of a start bit. The start bit which is serially transmitted thru each cascaded integrated circuit filter controls the initiation of the serial addition prrformed by each integrated circuit. The time overlapped addition operations result in a small communication overhead and provides efficient parallelism.

Figure 6:
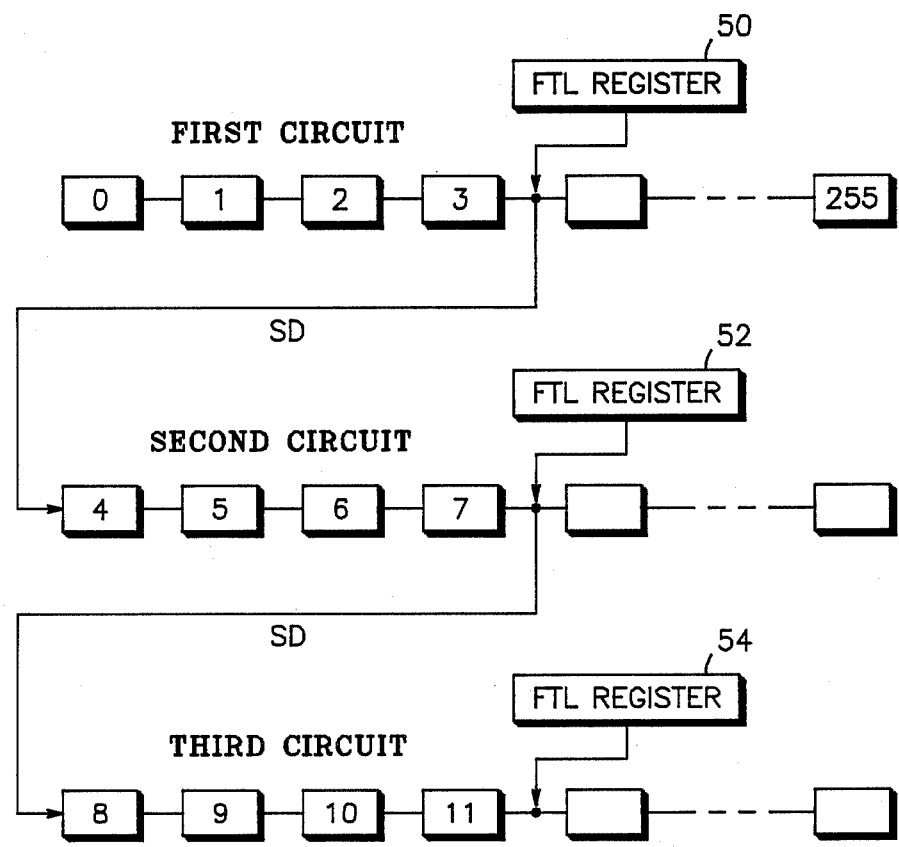
FIG. 6 illustrates in block diagram form a programmable tap length feature of the structure of FIG. 2.

Shown in FIG. 6 is a tap length arrangement illustrating how the cascaded filter circuit of FIG. 2 may be implemented to easily have a variable programmable tap length, N. As used herein, "tap" generally refers to a stored data sample used in the calculation of a filter algorithm, such as equation 1 above. Each of three FIR filter integrated circuits is illustrated in FIG. 6 as having a potential two hundred fifty-six taps. A filter tap length (FTL) register 50 stores a predetermined operand received from host processor 21 which selects a particular point between the two hundred fifty-six taps of the first circuit which is used as the output point of the serial data (SD). A filter tap length (FTL) register 52 also stores a predetermined operand which selects a particular point between the 256 taps of the second circuit. The point selected in the second circuit is used as the output of the serial data (SD) for the second circuit. A filter tap length (FTL) register 54 also stores a predetermined operand which selects a particular point between the 256 taps which is used as the output of the serial data (SD) for the third circuit. Therefore, registers 50, 52 and 54 may be programmed in the illustrated form so that a composite three circuit filter has as few as three taps or as many as seven hundred sixty-eight taps. As shown, FTL register 50 is programmed so that the first circuit has four taps labeled "zero" through "three". FTL register 52 is programmed so that the fifth thru eighth taps of the composite filter are provided by the second circuit as shown by taps labeled "four" thru "seven". Similarly, FTL register 54 is programmed so that the ninth thru twelveth taps of the composite filter are provided by the third circuit as shown by taps labeled "eight" thru "eleven". As a result, a very flexible filter is provided in which a composite filter structure may be programmed to a variable degree of accuracy depending upon the application. Although the illustrated example has assumed an equal number of taps per discrete integrated circuit component, the present invention may be practised with a variable number of taps per circuit and a variable number of taps programmed for each circuit.

By now it should be apparent that a method and structure has been provided for combining partial sums in a cascaded multiple chip filter environment having high speed sampling rates and a large number of taps. A method is also taught wherein a filter structure having a programmable tap size is provided. As a result, the filter's sampling frequency may be widely varied in response to a particular application requirement. When multiple integrated circuits are cascaded in accordance with the present invention to provide a single filter structure, the sampling frequency of the filter is markedly increased compared to using a single integrated circuit having the same total number of filter taps.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A cascade filter structure having a plurality of rank ordered filter circuits, each of said filter circuits performing predetermined arithmetic calculations on predetermined operands to provide one of a plurality of rank ordered output operands, said rank ordered output operands being serially added by each rank ordered filter circuit except the lowest ranked filter circuit by an interface circuit in each filter circuit, each of said interface circuits comprising:

an input terminal for receiving a rank ordered output operand of immediately lower rank;

data initiation detection means coupled to the input terminal for providing a control signal in response to detection of receipt of the output operand of immediately lower rank for use as a first addend;

control means for providing a second addend resulting from the predetermined calculation of the filter circuit of current rank, said second addend being provided by the control means in response to the control signal and synchronous with receipt of the first addend; and adder means coupled to the input terminal and the control means, for adding the first and second addends and outputting a sum as the rank ordered output operand of predetermined rank.

2. The cascade filter structure of claim 1 wherein said data initiation detection means detects the receipt of the output operand by detecting a digital start bit preceeding the output operand of lower rank.

3. The cascade filter structure of claim 1 wherein said control means further comprise:

a shift register having a data input for receiving and storing the second addend, a clock input for receiving the control signal, and an output for providing the second addend in synchronization with receipt of the first addend.

4. The cascade filter structure of claim 1 wherein said adder means further comprise:

a full adder circuit having a first addend input coupled to the input terminal, a second addend input coupled to the control means, a sum output terminal for providing the output operand of predetermined rank, a carry input terminal and a carry output terminal; and a flip-flop circuit having an input coupled to the carry output terminal of the full adder circuit, an output terminal coupled to the carry input terminal of the full adder circuit, and a control terminal for receiving a clock signal, said clock signal clocking the flip-flop circuit in synchronization with a predetermined frequency of the control signal.

5. The cascade filter structure of claim 1 wherein each of the rank ordered circuits further comprises:

a programmable storage means for storing an operand value indicating a predetermined filter tap length of each circuit whereby each circuit has a predetermined range of filter tap length values, said filter tap length determining an amount of the arithmetic calculations each circuit performs, said cascade filter structure having a tap length equal to the sum of the programmed tap lengths of each of the plurality of circuits.

6. A cascade filter structure having a plurality of discrete rank ordered circuits, each of the circuits executing predetermined filter algorithms and providing a rank ordered partial addend, each rank ordered partial addend except the lowest ranked partial addend being added with a rank ordered partial addend of immediately lower rank by a corresponding ranked one of a plurality of rank ordered interface portions to provide a rank ordered output operand, the highest rank ordered circuit providing a filter output, the lowest rank ordered of said interface portions providing a start bit during a first cycle of predetermined length followed by the lowest rank ordered partial addend of predetermined bit length at one bit per cycle, said remaining rank ordered circuits receiving the start bit in succession one cycle later for each successively higher ranked circuit and adding respective rank ordered partial addends concurrently to provide the filter output within a number of cycles after the lowest ranked output operand is provided equal to the plurality of rank ordered circuits.

7. The cascade filter structure of claim 6 further comprising programmable means in each circuit for controlling accuracy of each ranked output by selecting a number of data samples utilized by each circuit in executing the predetermined filter algorithm for each circuit.

8. In a cascade filter structure having a plurality of discrete filter circuits performing predetermined arithmetic calculations on predetermined operands, wherein the improvement comprises:

programmable storage means for storing an operand value indicating a selected one of a plurality of filter tap lengths within a predetermined range of filter tap length values, said filter tap length determining a number of arithmetic calculations each circuit performs, said cascade filter structure having a tap length equal to a sum of the programmed tap lengths of each of the plurality of circuits; and coupling means for serially coupling each of the discrete filter circuits.

* * * * *